United States Patent
McGrath et al.

(10) Patent No.: US 11,695,535 B2
(45) Date of Patent: Jul. 4, 2023

(54) RECONFIGURABLE MIXER DESIGN ENABLING MULTIPLE RADIO ARCHITECTURES

(71) Applicant: XILINX, INC., San Jose, CA (US)

(72) Inventors: John Edward McGrath, Tipperary (IE); Gourav Modi, Dublin (IE); Rhona Wade, Dublin (IE)

(73) Assignee: XILINX, INC., San Jose, CA (US)

( * ) Notice: Subject to any disclaimer, the term of this patent is extended or adjusted under 35 U.S.C. 154(b) by 211 days.

(21) Appl. No.: 17/199,193

(22) Filed: Mar. 11, 2021

(65) Prior Publication Data

US 2022/0294598 A1 Sep. 15, 2022

(51) Int. Cl.
*H04L 5/14* (2006.01)
*H03D 7/00* (2006.01)
*H03K 19/177* (2020.01)

(52) U.S. Cl.
CPC .............. *H04L 5/14* (2013.01); *H03D 7/00* (2013.01); *H03K 19/177* (2013.01)

(58) Field of Classification Search
CPC ....................................................... H04L 5/14
See application file for complete search history.

(56) References Cited

U.S. PATENT DOCUMENTS

| | | | |
|---|---|---|---|
| 6,433,354 B1 | 8/2002 | Thompson et al. | |
| 10,720,926 B1 | 7/2020 | McGrath et al. | |
| 2005/0164648 A1* | 7/2005 | Gannholm | H04B 17/29 455/67.14 |
| 2012/0219124 A1* | 8/2012 | Chen | H04L 43/08 379/32.04 |
| 2017/0317738 A1* | 11/2017 | Lange | H04B 7/155 |
| 2019/0097636 A1* | 3/2019 | Azizi | H03K 19/17764 |

FOREIGN PATENT DOCUMENTS

WO 2018203968 A1 11/2018

* cited by examiner

*Primary Examiner* — Hsinchun Liao
(74) *Attorney, Agent, or Firm* — Patterson + Sheridan, LLP

(57) ABSTRACT

Embodiments herein describe an integrated circuit with a digital front end (DFE) that includes multiple hardened mixers that can be configured to support multiple different radio paths. The DFE provides the ability to distribute the processing across the multiple mixers, which can be combined and synchronized to create a larger mixer or may be used in other combinations to create multiple discrete mixers.

20 Claims, 11 Drawing Sheets

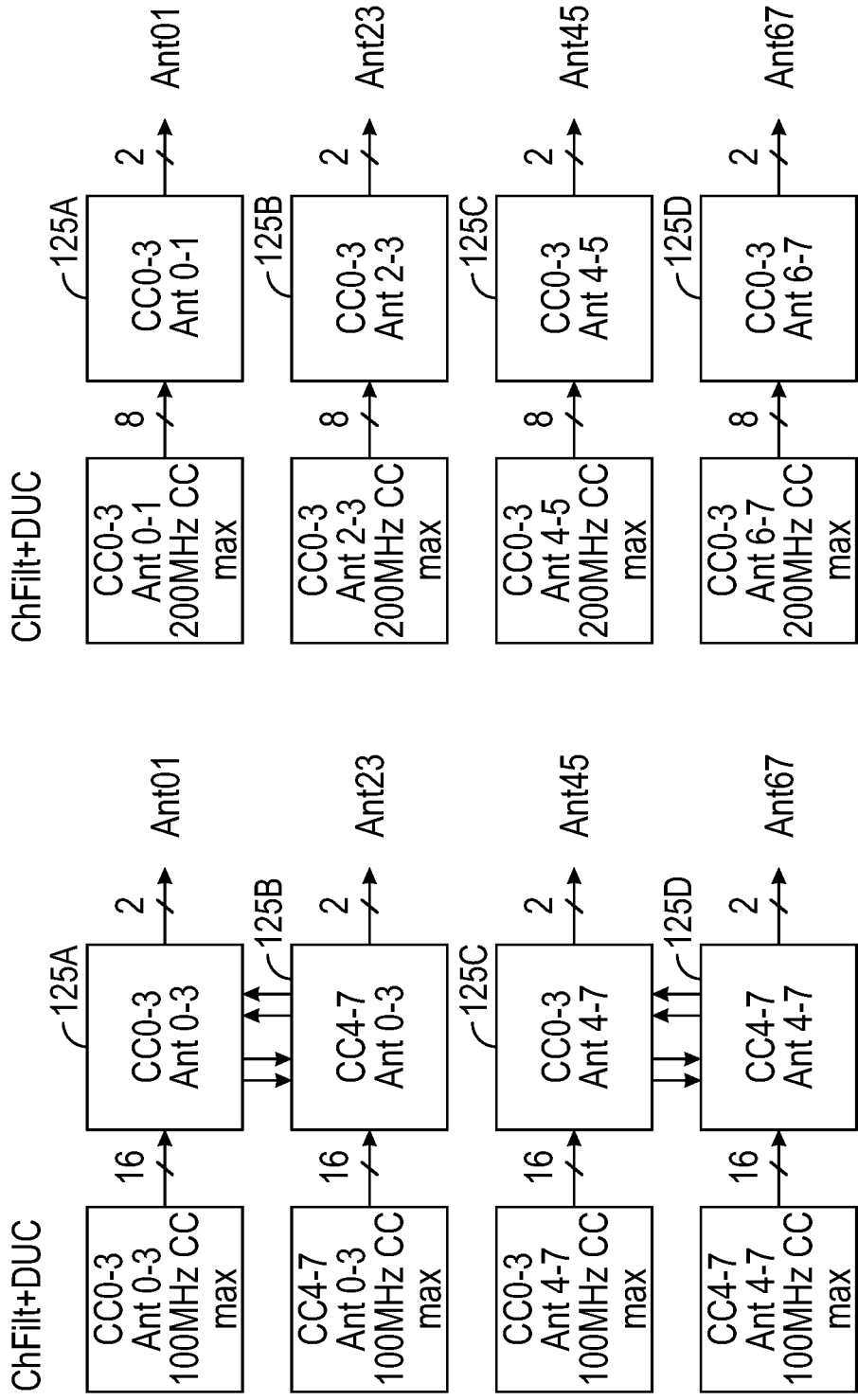

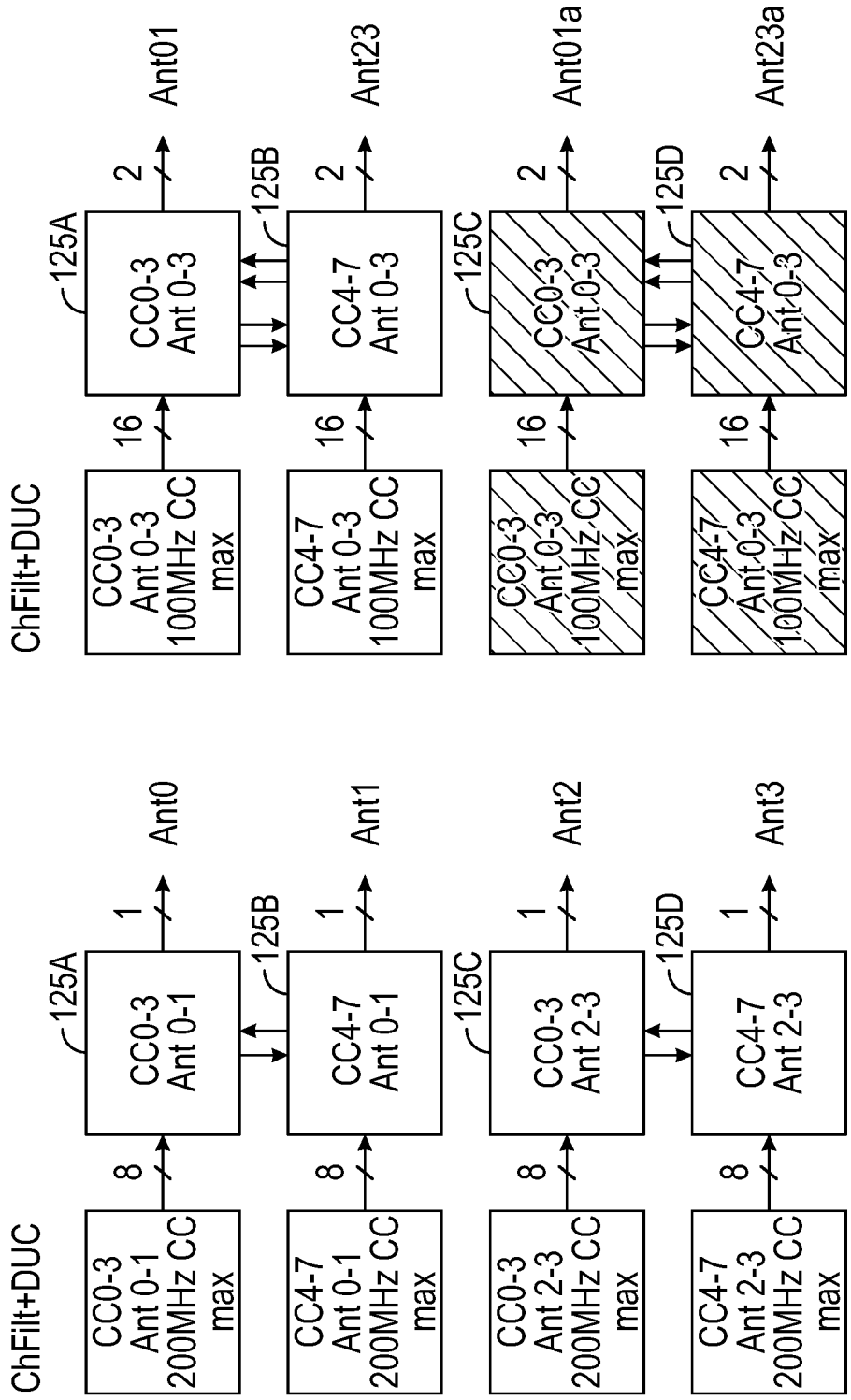

RECONFIGURABLE MIXER DESIGN ENABLING MULTIPLE RADIO ARCHITECTURES

TECHNICAL FIELD

Examples of the present disclosure generally relate to reconfigurable mixer designs implemented in hardened circuitry that provide the flexibility of mixers implemented in programmable logic.

BACKGROUND

There are several possible combinations of radio datapaths in modern wireless systems. For example in 4G/5G there are LTE, FR1 and FR2 bands, each of which can require multiple individual component carriers (CCs or channels), varying carrier bandwidth, and multiple antennas. Some example combinations are one radio that supports eight carriers over eight antennas, two radios that each supports eight carriers over four antennas, fewer widerbandwidth carriers, and mixed configurations where two radios may have different bandwidths, different number of carriers, or different number of antennas.

Currently, for a Digital Front End (DFE) to support all these different radio data-paths, the DFE typically contains a mixer implemented in programmable logic. This gives the customer the flexibility to configure the mixer to enable the particular radio data path the customer has selected. However, implementing mixers using programmable logic incurs lamer area and power costs than mixers implemented using hardened circuitry. That is, mixers implemented using programmable logic provide flexibility to enable different radio data path configurations but at the cost of larger area and power consumption relative to hardened mixers.

SUMMARY

One embodiment describes a digital front end (DFE) that includes first and second mixers implemented in hardened logic, each comprising a plurality of subunits and circuitry configured to form inter-mixer communication paths connecting at least one of the plurality of subunits in the first mixer to at least one of the plurality of subunits in the second mixer. Further, the first and second mixers are configured to, when operating in a downlink (DL) path of a radio, synchronously operate to effectively form a single, larger mixer using the inter-mixer communication paths.

Another embodiment described herein is a DPE that includes first and second mixers implemented in hardened logic, wherein the first and second mixers are configured to synchronously operate to effectively form a first larger mixer for use in a downlink (DL) path of a radio and third and fourth mixers implemented in hardened logic, wherein the third and fourth mixers are configured to synchronously operate to effectively form a second larger mixer for use in an uplink (UL) path of the radio.

Another embodiment described herein is an integrated circuit that includes first and second mixers implemented in hardened logic, each comprising a plurality of subunits and circuitry configured to form inter-mixer communication paths connecting a subset of the plurality of subunits in the first mixer to a subset of the plurality of subunits in the second mixer. The first and second mixers are configured to, when operating in a downlink (DL) path of a radio, effectively form a single, larger mixer using the inter-mixer communication paths.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 5-9 illustrate different radio path configurations of the mixers in FIG. 4, according to an example.

DETAILED DESCRIPTION

Figure 1:
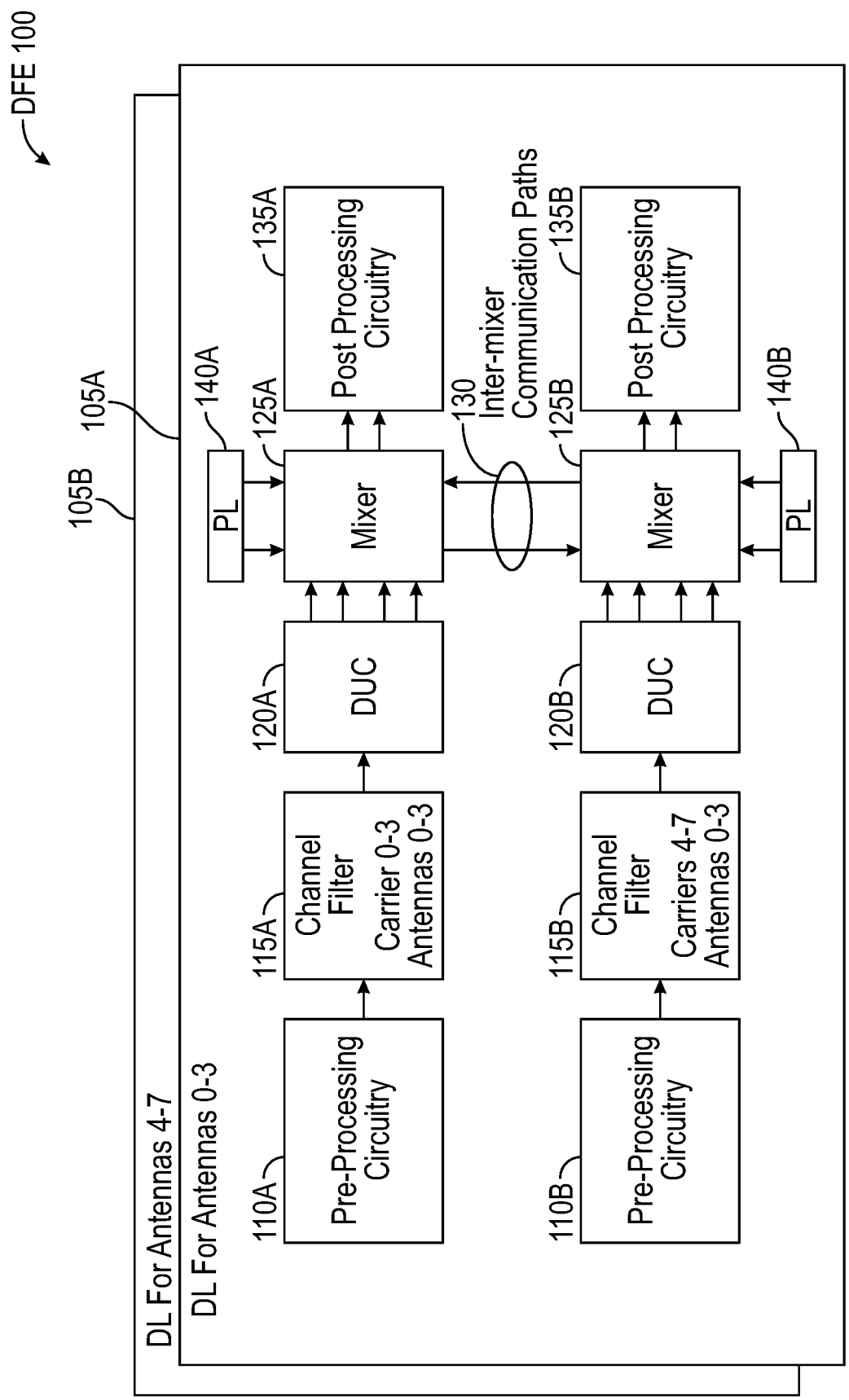
FIG. 1 is a block diagram of a DFE with mixers in a downlink radio path, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe an integrated circuit with a DFE that includes multiple hardened mixers that can be configured to support multiple different radio paths. Moreover, due to the inherent flexible architecture of the mixers, dynamic switching between the downlink (DL) and up-link (UL) is supported. Furthermore, the hardened mixers can leverage additional radio channels from programmable logical (e.g., a programmable fabric) inside the integrated circuit to extend the customer use-cases. In addition, the design is scalable as the fundamental blocks such as the Numerically Controlled Oscillators (NCO) and Complex Multipliers (CM) can be scaled based on the size of the integrated circuit and the customer use-cases. The DFE also provides the ability to distribute the processing across multiple mixers, which can be combined and synchronized to create a larger carrier/Antenna mixer or may be used in other combinations to create multiple discrete carrier/Antenna mixers.

FIG. 1 is a block diagram of a DFE 100 in an integrated circuit (IC) with mixers 125 in a DL 105 radio path, according to an example. The DFE 100 in FIG. 1 includes two DL 105 paths for supporting eight antennas. That is, the DL 105A supports Antennas 0-3 while the DL 105B supports Antennas 4-7. However, as discussed below, the same circuitry illustrated in FIG. 1 can be configured to serve as a UL radio path, or serve as both a DL and UL paths using time division duplexing (TDD).

The DL 105 includes two copies of pre-processing circuitry 110, channel filters 115, digital up converters (DUCs) 120, mixers 125, post processing circuitry 135, and programmable logic (PL) 140. While the DL 105 is configured to serve four antennas, this is just for illustration purposes. The DFE 100 could include circuitry for providing DL links for fewer than eight antennas, or more than eight antennas.

Although not shown, the pre-processing circuitry 110A and 110B receives analog signals from the Antennas 0-3. The pre-processing circuitry 110 is not limited to any particular circuitry and can include such hardware components as frequency domain buffers, circuitry for performing transforms (e.g., FFT and IFFT), and time domain buffers. Some of the pre-processing circuitry 110 may be implemented using hardened logic, PL, or a combination of both. While the embodiments herein can benefit from an integrated circuit that includes some PL, such as in a field programmable gate array (FPGA) or a system on a chip (SoC) that has a mix of PL and hardened circuitry, the features described herein can be used in an application specific integrated circuit (ASIC) that does not have any PL. While PL (e.g., a programmable fabric) provides flexibility in reconfiguring the connections between the various elements in FIG. 1, this flexibility can be provided in an ASIC with routing elements such as switches and multiplexers.

The signals provided by the pre-processing circuitry 110 are received at the channel filters 115. In this example, the channel filter 115A filters signals corresponding to carriers 0-3 while the channel filter 115B filters signals corresponding to carriers 4-7. While not shown, the DL 105B receives data transmitted over the same carriers (i.e., Carriers 0-7) as the DL 105A but the data is received using Antennas 4-7 rather than Antennas 0-3. However, other configurations of the circuitry in FIG. 1 are possible to support different radio paths configurations, some of which are illustrated in FIGS. 5-9 below. For example, while FIG. 1 illustrates the DL 105A and 105B forming a DFE 100 for a single radio with eight antennas that receive data over eight carriers, the DFE 100 could be reconfigured to support a single radio with more carriers (and less bandwidth per carrier), a single radio with fewer carriers (but more bandwidth per carrier), or multiple radios.

The DUCs 120 receive the filtered signals from the channel filters 115 and provide up converted signals to the mixers 125. One advantage of the embodiments herein is that the mixers are separated into discrete, independent mixers 125 that can either operate independently to enable multiple radios or be synchronized to operate with each other to form a larger radio, as is the case in FIG. 1. In one embodiment, the mixers 125 have their own independent clock, independent reset signal, and independent inputs/outputs. Moreover, the mixers 125 can have different sample rates. However, on the other hand, the mixers 125 can be synchronized as shown in FIG. 1 to have the same clock and dependent inputs/outputs so they can be used as a larger mixer (e.g., a mixer with more channels that are synchronized) to support larger radios. As discussed below, the states of oscillators in the mixers 125 can be synchronized so that the can effectively operate as a single, larger mixer.

To effectively operate as a larger mixer, the DFE 100 includes inter-mixer communication paths 130 that permit the mixers 125 to share data. Doing so enables the DL 105 to operate as an effectively larger radio (e.g., more antenna, more carriers, or more bandwidth) than if the mixers 125 were unable to share data. The inter-mixer communication paths 130 can be implemented using PL, or in the case of an ASIC, hardened routing elements. The inter-mixer communication paths 130 are described in more detail in FIG. 3.

The mixers 125 are also coupled to PL 140, which is optional. In one embodiment, the PL 140 is used for carrier generation or processing where the PL 140 provides inputs to be mixed when the mixers 125 are being used as part of the DL 105. Generally, the mixers 125 mix multiple carriers to form a composite output per each antenna.

In this example, the mixer 125A outputs data corresponding to two of the antennas (e.g., Antenna 0 and 1) to the post processing circuitry 135A while the mixer 125B outputs data corresponding to the other two antennas (e.g., Antenna 2 and 3) to the post processing circuitry 135B. The embodiments herein are not limited to any particular type of post processing circuitry 135 which can include equalizers, I/O imbalance correction circuits, automatic gain control, digital to analog converters (DAC), analog to digital converters (ADC), and the like.

The output of the post processing circuitry 135 can be transmitted to different components in the IC containing the DFE 100. In this example, the DLs 105A and 105B function as a single radio despite the fact the DFE 100 contains four independent mixers 125 (two in each DL 105). Put differently, by synchronizing the mixers 125 in the DLs 105 and using the inter-mixer communication paths 130, they can serve as a DFE 100 for a radio with eight antennas that support eight carriers.

Figure 2:
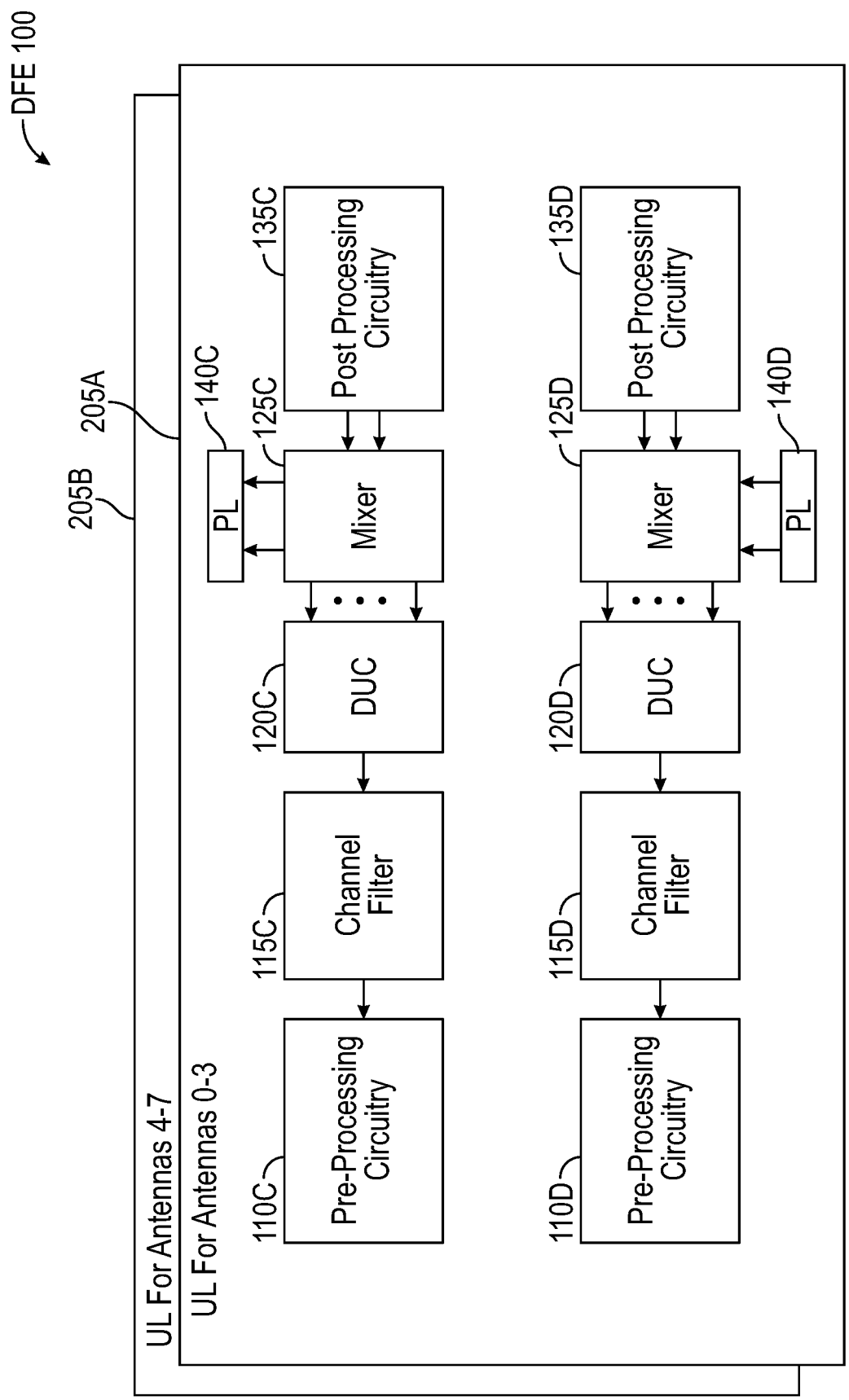
FIG. 2 is a block diagram of a DFE with mixers in an uplink radio path, according to an example.

FIG. 2 is a block diagram of the DFE 100 with mixers in an UL 205 radio path, according to an example. The DFE 100 in FIG. 2 represents two possible examples. In one example, the circuitry in FIG. 2 can be combined with the circuitry in FIG. 1 to form a single DFE 100 where the circuitry in FIG. 1 forms the DLs for the radio while the circuitry in FIG. 2 forms the ULs for the same radio. Additionally, FIGS. 1 and 2 illustrate an embodiment where the same circuity (e.g., the pre-processing circuitry 110, channel filters 115, DUCs 120, mixers 125, post processing circuitry 135, and PL 140) is used to form both the DLs and the ULs for the same radio. In that example, FIG. 1 illustrate when the circuitry performs the DL function while FIG. 2 illustrates when that same circuitry performs the UL function. In that case, TDD can be used where, at any given time, the circuitry in FIGS. 1 and 2 is performing only one function: either DL or UL, but not both. However, to do so, the state of NCOs in the mixers 125 should be maintained (e.g., tracked) to enable the mixers 125 to switch from being part of the DL to being part of the UL and vice versa. This is discussed in more detail in FIG. 4.

Generally, the ULs 205 in FIG. 2 operate in reverse from the DLs 105 in FIG. 1. Other components in the same IC as the DFE 100 can send data to the post processing circuitry 135 that should be transmitted on the Antennas 0-7. Instead of mixing the signals together (which is the purpose of the mixers 125 when serving in the DL), the mixers 125 separate (or extract) the signals. That is, instead of mixing multiple carriers when functioning in the DL, the mixers 125 when operating in the ULs 205 take each antenna input and split (extract) the signal to multiple carrier outputs. In this example, the mixers 125 transmit data to the PL 140 to assist in the extraction process. Further, when the mixers 125 are part of the UL 205, they might not need to use the inter-mixer communication paths in order to extract the input signals to form multiple carrier outputs. Put differently, the inter-mixer communication paths 130 in FIG. 1 may be used only when the mixers 125 are in the DL, and only when multiple mixers are configured to effectively operate as a larger mixer. Nonetheless, like in FIG. 1, the mixers 125 are synchronized when operating in the UL path so they function like a single, larger mixer so they can support the larger radio.

The resulting carrier data is provided to the DUC 120, channel filter, 115, and the pre-processing circuitry 110 which then provide a signal that is transmitted by the Antennas 0-7.

Figure 3:
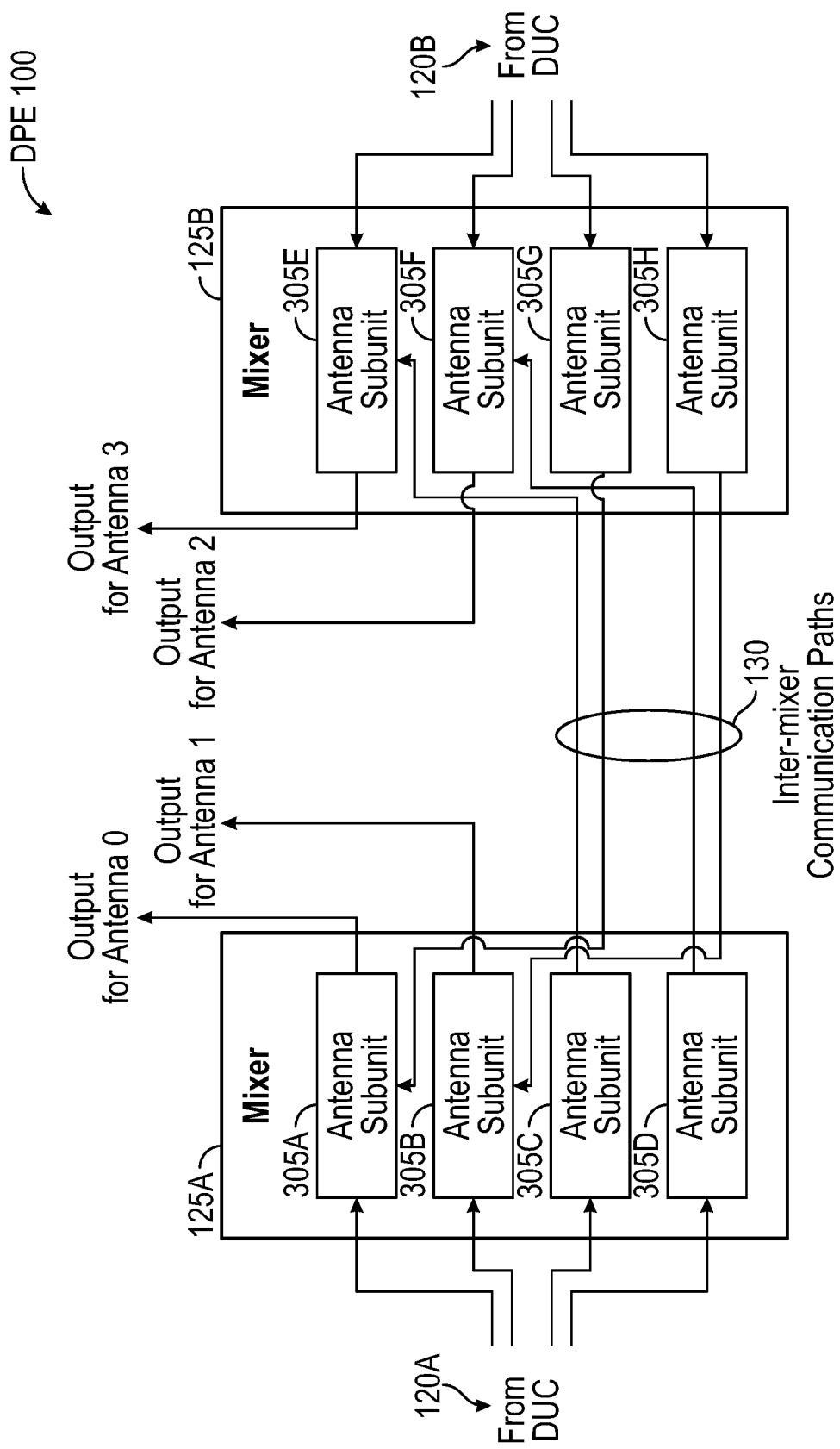
FIG. 3 illustrates mixers in a downlink radio path sharing data between antenna subunits, according to an example.

FIG. 3 illustrates mixers 125 in a DL radio path sharing data between antenna subunits, according to an example. FIG. 3 provides additional details of the mixers 125A and 125B being used in the DL illustrated in FIG. 1. As shown, each mixer 125 includes four antenna subunits 305 (which are illustrated in greater detail in FIG. 4) but in other embodiments may have more, or fewer, subunits 305. Each antenna subunit 305 in this example receives an input which corresponds to a different carrier. Referring again to FIG. 1, the mixer 125A receives the signals corresponding to carriers 0-3 from the DUC 120A while the mixer 125B receives the signals corresponding to carriers 4-7 from the DUC 120B; however, this is just one example.

As mentioned above, the mixers 125 work in tandem to mix the carriers to form a composite output for each antenna. This is done by synchronizing the mixers which can be accomplished by resetting the mixers at the same time and operating them using a synchronized clock and sampling rate, as well as using the inter-mixer communication paths 130.

As shown, the outputs of two of the sub-units 305 in each mixer 125 are used as inputs to two of the sub-units 305 in the other mixer 125. That is, the outputs of the antenna subunits 305C and 305D in the mixer 125A are inputs to the antenna subunits 305E and 305F, respectively, in the mixer 125B. Similarly, the outputs of the antenna subunits 305G and 305H in the mixer 125B are inputs to the antenna subunits 305A and 305B, respectively, in the mixer 125B. The inter-mixer communication paths 130 permit the antenna sub-units 305 in different mixers 125 to communicate with each other as part of the mixing function. These paths 130 can be implemented using circuitry such as a PL fabric or a plurality of routing elements (e.g., switches and multiplexers).

Figure 4:
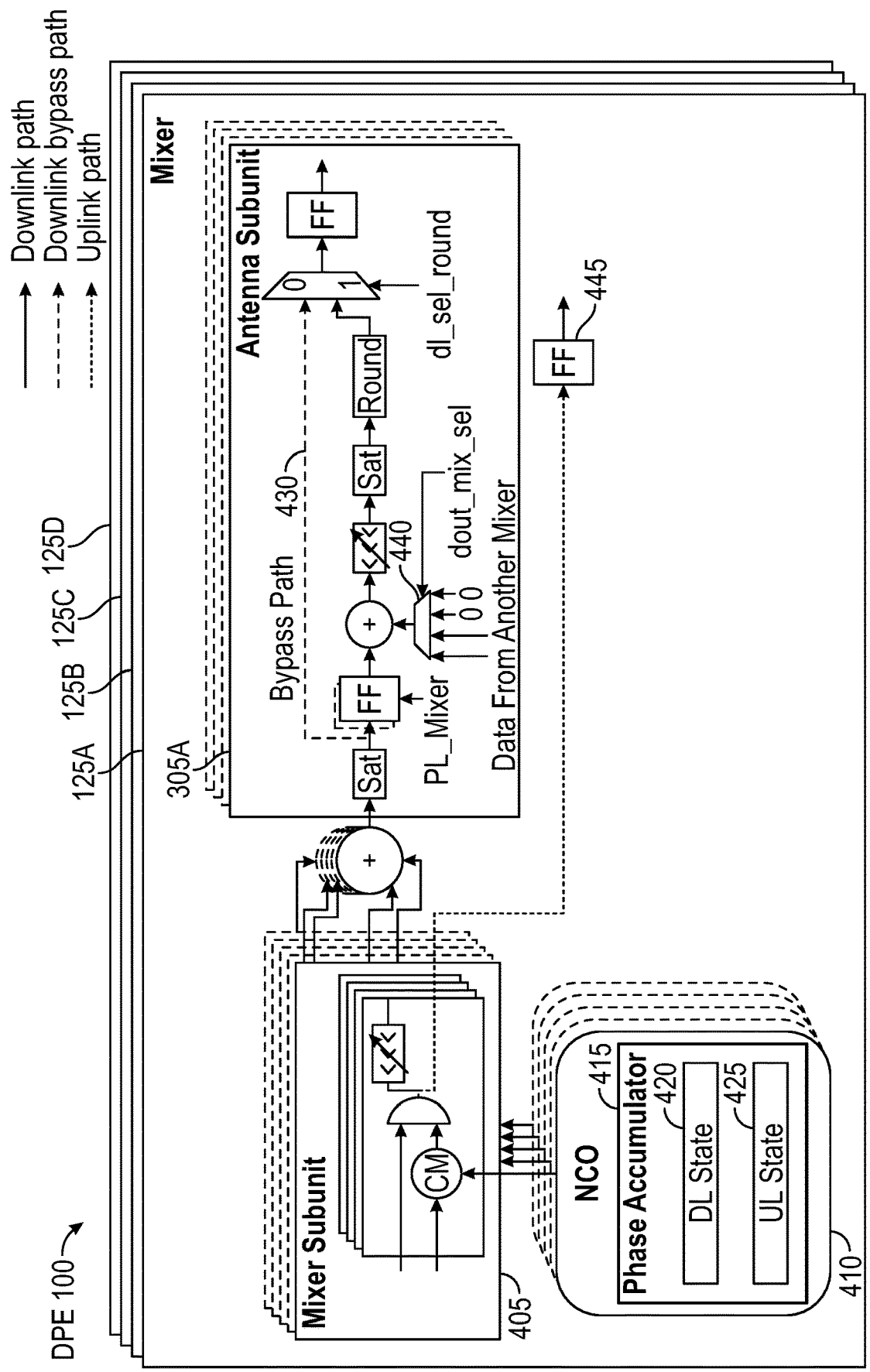
FIG. 4 illustrates various circuitry in mixers in a DFE, according to an example.

The antenna sub-units 305 receiving the outputs of the other sub-units then mix those carriers with their own received carriers to generate a respective output for each antenna. That is, the antenna subunit 305A provides the output corresponding to Antenna 0, the antenna subunit 305B provides the output corresponding to Antenna 1, the antenna subunit 305E provides the output corresponding to Antenna 2, and the antenna subunit 305F provides the output corresponding to Antenna F. In one embodiment, the antenna subunits 305 in the mixers 125 that provide outputs to other subunits 305 do not process the received data. As shown in FIG. 4, the subunits 305 can include bypass paths so when the mixers need to use the inter-mixer communication paths 130 in order to form a larger mixer, the mixing circuity in the subunits 305 (i.e., the subunits 305B-C and 305G-H) can be bypassed.

FIG. 4 illustrates various circuitry of mixers in a DFE 100, according to an example. In this example, the DFE 100 includes four mixers 125A-D which each have five mixer subunits 405 and four antenna subunits 305. FIG. 4 illustrates the path data follows in the mixer 125A when the mixer is used as part of the DL (shown by the solid lines), being bypassed in the DL (shown by the hashed lines), and is used as part of the UL (shown by the dotted lines).

When configured as part of the DL path, the mixer subunits 405 receive the carrier data from the DUC (not shown). After being processed by the circuitry in the subunits 405 to mix individual carriers with the associated NCO 410 and then optionally to gain the signals, the subunits 405 forward the data to an adder circuit that sums the output of the subunits 405 to create the individual antenna signals that feed the antenna subunits 305. If the mixer 125A is operating independently (i.e., is not synchronized with another mixer 125 in the DFE 100 to effectively form a larger mixer), then the antenna subunits 305 use the circuitry shown to process the summed data and generate an output for one or more antennas.

However, when the mixer 125A is synchronized with another mixer 125 in the DFE 100, then the inter-mixer communication paths (not shown here) are used so that some of the antenna subunits 305 in the mixer 125A can transmit and receive data from antenna subunits 305 in another mixer 125. For example, assuming the antenna subunit 305A outputs data to an antenna subunit in a different mixer 125, then the data received from the adder circuit follows the bypass path 430 around the mixer circuitry and is then transmitted, using the inter-mixer communication paths, to an antenna subunit in a different mixer as shown in FIG. 3.

Alternatively, the antenna subunit 305A may receive an input data from an antenna subunit in a different mixer. This data is received by the mux 440 and then combined with the carder signal the subunit 305 received from the mixer subunits 405. This combined signal is then processed by the mixer circuitry in the antenna subunit 305A as shown by the solid lines. The output of the antenna subunit 305A may correspond to one or more of the antennas as shown in FIG. 3.

When configured as part of the UL path, the mixer subunits 405 receive the data from post processing circuitry (e.g., the post processing circuit 135 in FIG. 1). After being processed by the circuitry in the subunits 405 to mix (extract) individual carriers from the composite antenna inputs, the subunits 405 forward the data along the dotted lines to the flip flop (FF) 445. The FF 445 then outputs the data to the DUC (not shown) for further processing. In this manner, FIG. 4 illustrates the various data flows through the mixers 125 when part of the DL and the UL.

In addition to the subunits 405 and 305, the mixers 125 also include a plurality of NCOs 410. In one embodiment, the NCOs 410 are the only circuitry in the mixers 125 that maintain a state. Maintaining a state of the NCOs 410 is useful when the mixer 125 switches back and forth from operating in the DL and the UL. When switching from DL and UL mode, the UL carriers might have different NCO frequencies and/or phases than the DL carriers, thus requiring the NCOs to have different states. As shown, the NCOs 410 have a phase accumulator 415 which has a DL state 420 which is used when the mixer 125 is part of the DL path and a UL state 425 when the mixer 125 is part of the UL path. In this manner, the mixer 125 can switch between UL and DL using the maintained states in the phase accumulator 415 of the NCOs 410. As a result, the same circuitry (i.e., the same NCOs) can be used for both UL and DL by saving and changing their states. The other circuitry in the mixers 125 (e.g., the subunits 305 and 405) may not need to maintain states in order to switch between operating in the DL and UL paths.

Also, when multiple mixers are synchronized to operate as a larger mixer, the NCOs 410 in the mixers may have the same (e.g., mirrored) states. The mixers 125 can be reset at the same time so that the NCOs 410 have the same states. The NCOs 410 in multiple mixers 125 can be programmed to have the same frequency to make sure they operate in lockstep.

Further, flexible control, programming, and synchronization of each individual NCO 410 is provided, including real time interactions, such as clock-gating and phase-reset. Any unused channels in the mixers 125 are powered down. The mixer 125 may also take advantage of the fact that the time-slicing patterns of the previous stages (e.g. a four carrier four antenna radio) mean the input carriers are 'repeated' over each antenna. For example, there will be a Carrier 0 for Antennas 0, 1, 2, and 3. This means a single NCO 410 can be used to create the mixing frequency for these four input/output streams, which is an area and power saving strategy.

Further, the state of an NCO 410 in one mixer 125 can be maintained and copied to a NCO 410 in a different mixer 125. This is useful when moving a carrier from one mixer to another, which is discussed in more detail in FIG. 10.

FIGS. 5-9 illustrate different radio path configurations of the mixers 125 in FIG. 4, according to an example. FIG. 5 illustrates the four mixers 125 interoperating to form an 8×8 FR1 200 Mhz four carrier four antenna radio. In this embodiment, the mixers 125 are synchronized (along with the NCOs in the mixers 125) to form one radio with eight antennas where downstream processing is performed at 100 MHz. The data for eight carriers is shared at each mixer 125.

FIG. 6 illustrates the mixers 125 interoperating to form a single radio with eight antennas but only four carriers. However, each of the carriers has a larger bandwidth (200 MHz) than the carriers in the DFE for the radio illustrated in FIG. 5. While in FIG. 5 the mixers 125 relies on the inter-mixer communication paths, in FIG. 6 the mixers 125 do not need to share data since each mixer 125 has four subunits as shown in FIG. 4 (e.g., four mixer and antenna subunits), and thus, can mix the four carriers without sharing data with antenna subunits in another mixer.

FIG. 7 illustrates the mixers 125 interoperating to support a single radio where each mixer processes eight carriers. In this example, the channels are allocated on the left such that there are two antennas on the input of the mixers 125 but only one on the output.

FIG. 8 illustrates the four mixers 125 forming a DFE for two separate radios. The first radio is supported by the mixers 125A and 125B (which are synchronized) while the second radio is supported by the mixer 125C and 125D (which are synchronized). This illustrates one advantage of having multiple independent mixer blocks in the DFE. All the mixers 125 in the DFE can be synchronized to form a single mixer for one radio as shown in FIGS. 5-7 or a subset of the mixers can be synchronized to operate independently of the other mixers to support a different radio as is the case in FIG. 8. Here, the mixers 125A and 125B are part of a first radio with four antennas and eight carriers while the mixers 125C and 125D are part of a second radio with four antennas and eight carriers. Thus, the mixers 125A and 125B are synchronized with each other, while the mixers 125C and 125D are synchronized to each other. However, the frequency and sampling rate of the synchronized mixer pairs may be different.

Figure 9:
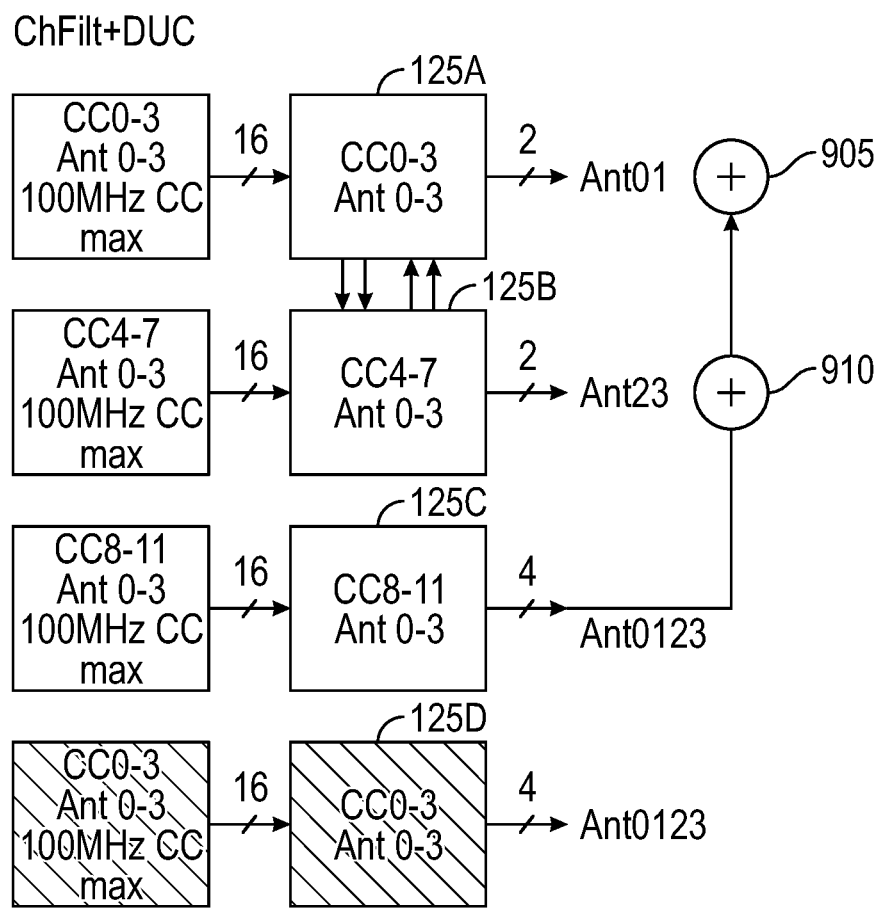

FIG. 9 illustrates another example where the mixers 125 in the same DFE can be part of separate radios. Here, the mixers 125A-C are synchronized and interoperate to form a first radio with four antennas and twelve carriers, while the mixer 125D is part of a second radio with four antennas and four carriers. Thus, FIG. 9 illustrates an asymmetric allocation of the mixers 125. In this example, the first radio has 300 MHz of bandwidth while the second radio has only 100 MHz.

Further, it may not be possible for the output of the three mixers 125A-C forming the first radio to be summed within the mixers 125. This can be done using external adders 905 and 910 which can be implemented in PL. However, in another embodiment, the mixer 125 may have sufficient internal adders to perform the summation within the mixers 125 using hardened logic.

Thus, FIGS. 5-9 illustrate hardened, independent mixers 125 in a DFE that have similar flexibility as mixers implemented in PL. That is, the mixers 125 can be reconfigured to operate synchronously, or independently, in order to support one, or multiple, radios. Thus, the mixers 125 save space relative to mixers implemented in PL without losing the flexibility offered by PL. In addition, unused channels in the mixers 125 can be deactivated which conserves power.

Figure 10:
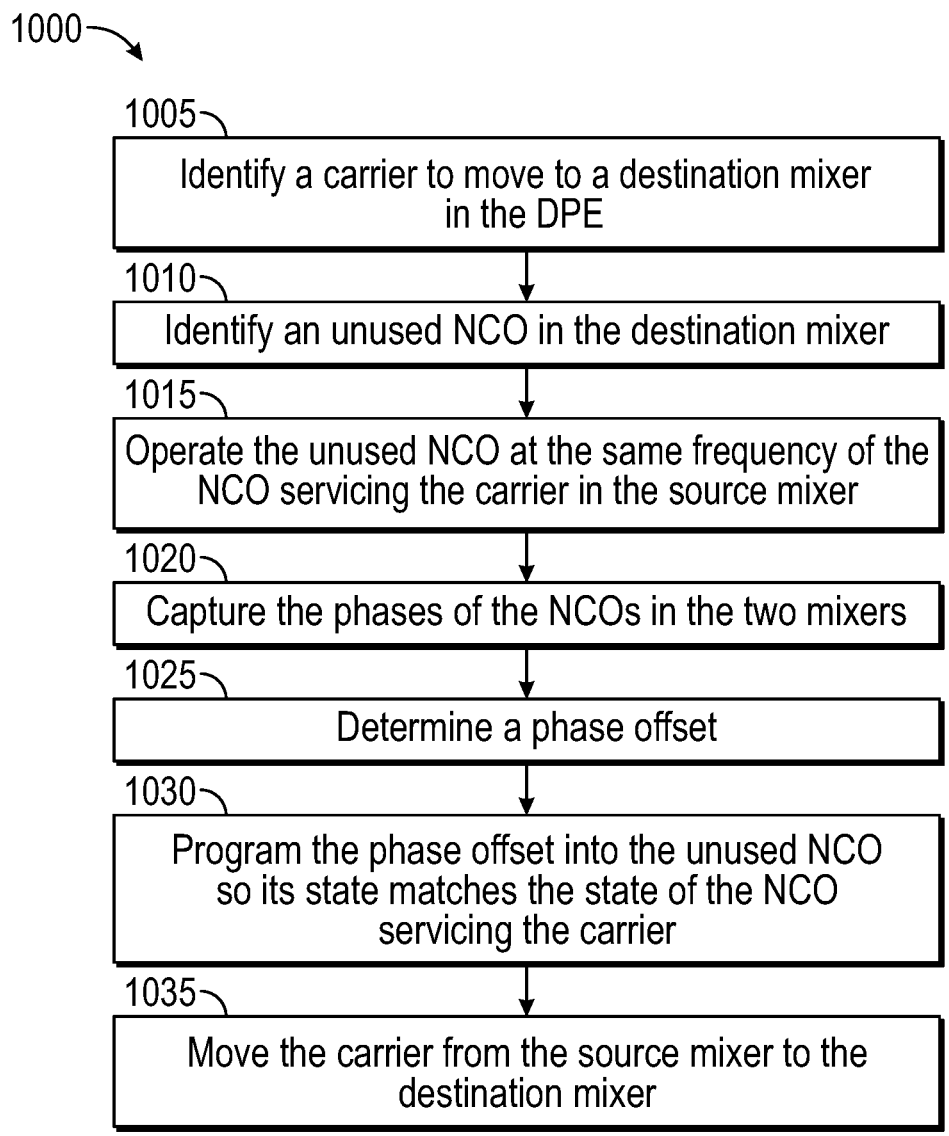
FIG. 10 is a flowchart for moving a carrier between mixers in a DFE, according to an example.

FIG. 10 is a flowchart of a method 1000 for moving a carrier between mixers in a DFE, according to an example. At block 1005, the system or a user identifies a carrier to move to a destination mixer in the DFE. For example, the processing resources downstream of the source mixer currently servicing the carrier may be overloaded. The system can identify the overloaded resources and identify processing resources that are not overloaded. The system can then use the method 1000 to reroute the carrier data through the destination mixer connected to the non-overloaded resources.

However, simply rerouting the carrier to the destination mixer may result in data corruption since the NCOs in the mixers may not be synchronized. As discussed above, the NCOs have a state which can be tracked when, e.g., the mixers switch between being part of the DL and UL paths. If a carrier is moved to a destination mixer without the NCO in the destination mixer having the same state as the NCO currently servicing the carrier, then the data may become corrupted. This data corruption may mean the move is not seamless. The method 1000 avoids this potential issue by ensuring a NCO in the destination mixer has the same state as the NCO currently servicing the carrier in the source mixer.

At block 1010, the system identifies an unused NCO in the destination mixer. That is, the destination mixer may have at least one NCO that is no currently being used to perform a mixer function.

At block 1015, the system operates the unused NCO at the same frequency as the NCO servicing the carrier in the source mixer. Thus, both NCOs now operate at the same frequency. However, this does not mean the two NCOs have the same state since the NCOs may also have different phases.

At block 1020, the source and destination mixers capture the phases of the NCOs. In one embodiment, the mixers have state capture logic which identifies the current phases of the NCOs. Each of the mixers (i.e., the source mixer currently carrying the carrier as well as the destination mixer) can capture the state or phase of the NCOs using this logic.

At block 1025, the system determines a phase offset between the two NCOs. That is, the system determines a delta phase between the two NCOs that defines their phase offset.

At block 1030, the system programs the phase offset into the unused NCO so its state now matches the state of the NCO currently servicing the carrier. The NCOs are now synchronized since they have the same frequency and phase.

At block 1035, the system moves the carrier from the source mixer to the destination mixer. Because the new NCO has the same state as the old NCO, this move is seamless to the perspective of the user and the carrier data is not interrupted. In one embodiment, the carrier is moved between the source and destination mixers by injecting the same data into both source and destination mixers, and once the output signal has propagated switch off the source and allow the destination mixer to drive the downstream system. The new mixer can then forward the data in the carrier to its downstream processing resource for further processing. In this manner, carriers (or channels) can be seamlessly moved between mixers to take advantage of available processing resources.

While the method 1000 is discussed in the context of moving a carrier between two different mixers, the same process can be used to mirror states between NCOs in the same mixer, if desired.

Figure 11A:
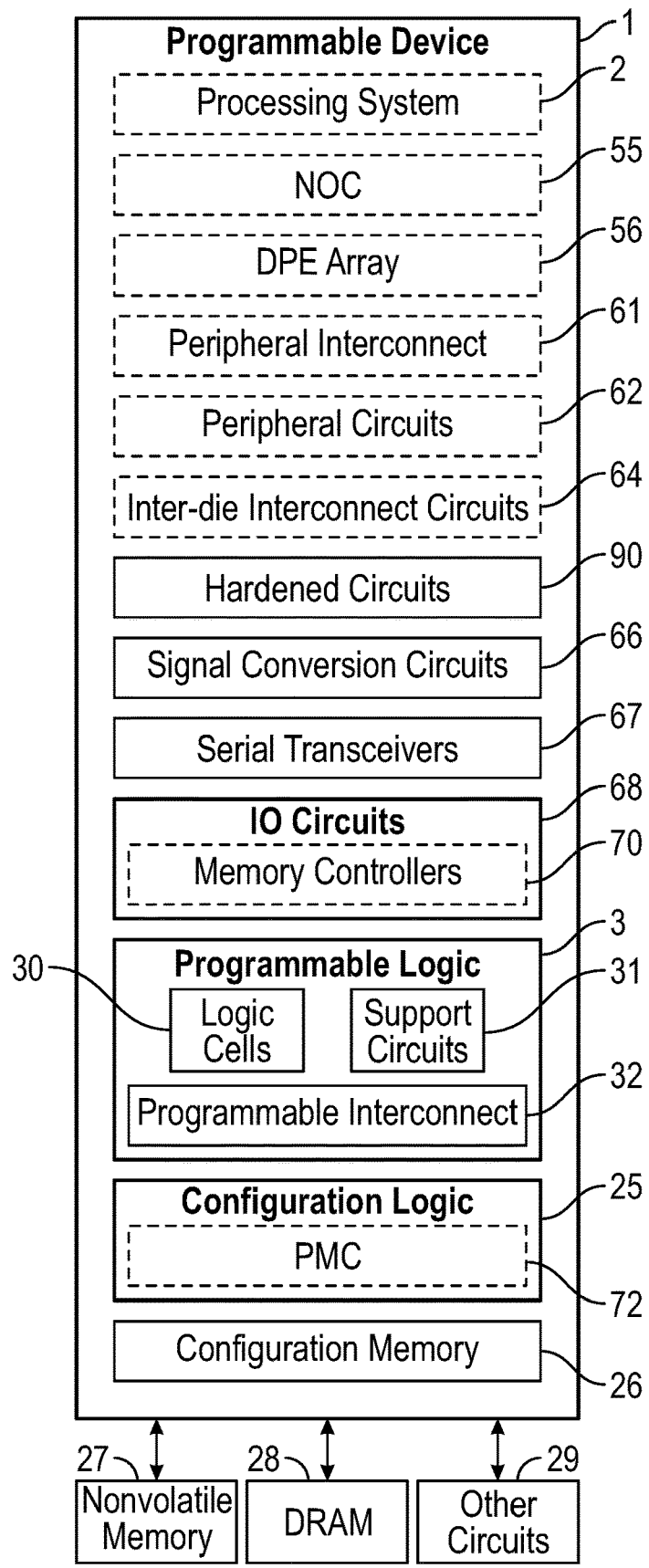
FIG. 11A is a block diagram depicting a programmable IC according to an example.

FIG. 11A is a block diagram depicting a programmable device 1 according to an example. The programmable device 1 includes programmable logic (PL) 3 (also referred to as a programmable fabric), input/output (IO) circuits 68, serial transceivers 67, signal conversion circuits 66, hardened circuits 90, configuration logic 25, and configuration memory 26. The programmable device 1 can be coupled to external circuits, such as nonvolatile memory 27, dynamic random access memory (DRAM) 28, and other circuits 29. In various examples, the programmable device 1 further includes a processing system (PS) 2, a network-on-chip (NOC) 55, a data processing engine (DPE) array 56, peripheral interconnect 61, peripheral circuits 62, and inter-die interconnect circuits 64.

The PL 3 includes logic cells 30, support circuits 31, and programmable interconnect 32. The logic cells 30 include circuits that can be configured to implement general logic functions of a plurality of inputs. The support circuits 31 include dedicated circuits, such as digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the configuration logic 25 includes a platform management controller (PMC) 72. The PMC 72 is configured to boot and configure the subsystems of the programmable device 1, such as the PL 3, the PS 2, the NoC 55, the DPE array 56, the signal conversion circuits 66, the hardened circuits 90, and the like.

The 10 circuits 68 provide an external interface for the subsystems of the programmable device 1, such as the PL 3, the PS 2, and the like. In some examples, the 10 circuits 68 include memory controllers 70 configured to interface external memories (e.g., the DRAM 28). Other connectivity circuits can include the peripheral interconnect 61, the peripheral circuits 62, and the inter-die interconnect circuits 64. The peripheral interconnect 61 includes bus interface circuits, such as peripheral component interconnect express (PCIe) circuits and the like. The peripheral circuits 62 include universal serial bus (USB) ports, Ethernet ports, universal asynchronous transceiver (UART) ports, serial peripheral interface (SPI) ports, general purpose 10 (GPIO) ports, serial advanced technology attachment (SATA) ports, and the like. The inter-die interconnect circuits 64 include circuits configured to interface like inter-die interconnect circuits in other programmable device(s) (e.g., for when the programmable device 1 is one die in a multi-die integrated circuit package). The serial transceivers 67 include high-speed transmit/receive circuits configured to provide an external IO interface for the programmable device 1.

The PS 2 can include microprocessor(s), memory, support circuits, IO circuits, and the like. The NOC 55 is configured to provide for communication between subsystems of the programmable device 1, such as between the PS 2, the PL 3, the hardened circuits 90, and the DPE array 56. The DPE array 56 can include an array of DPE's configured to perform data processing, such as an array of vector processors. The signal conversion circuits 66 include analog-to-digital converters (ADCs) and digital-to-analog converters (DACs).

The hardened circuits 90 comprise circuits with predetermined functionality. A given hardened circuit 90 can include one or more predetermined functions. Example hardened circuits 90 include filters, mixers, sample-rate converters, transforms circuits (e.g., Fast-Fourier Transform (FFT)), and the like. For example, the hardened circuits 90 may include the mixers discussed above in FIGS. 1-4. A hardened circuit 90 can be programmable to configure specific predetermined functionalities or select among predetermined functionalities. However, in contrast to a circuit in the PL 3, a hardened circuit 90 cannot be configured or reconfigured with different functionality. For example, a hardened circuit 90 can include a filter having two predetermined and selectable functionalities. A third functionality cannot be added to the hardened circuit 90, nor can one of the two functionalities be removed from the hardened circuit 90. In contrast, a filter configured in the PL 3 can be reconfigured to add one more additional functionalities or to remove one or more functionalities. Further, a filter configured in the PL 3 can be removed entirely and replaced with another circuit. In contrast, a hardened circuit 90 cannot be removed from the programmable device 1 (but can be unused if desired).

Figure 11B:
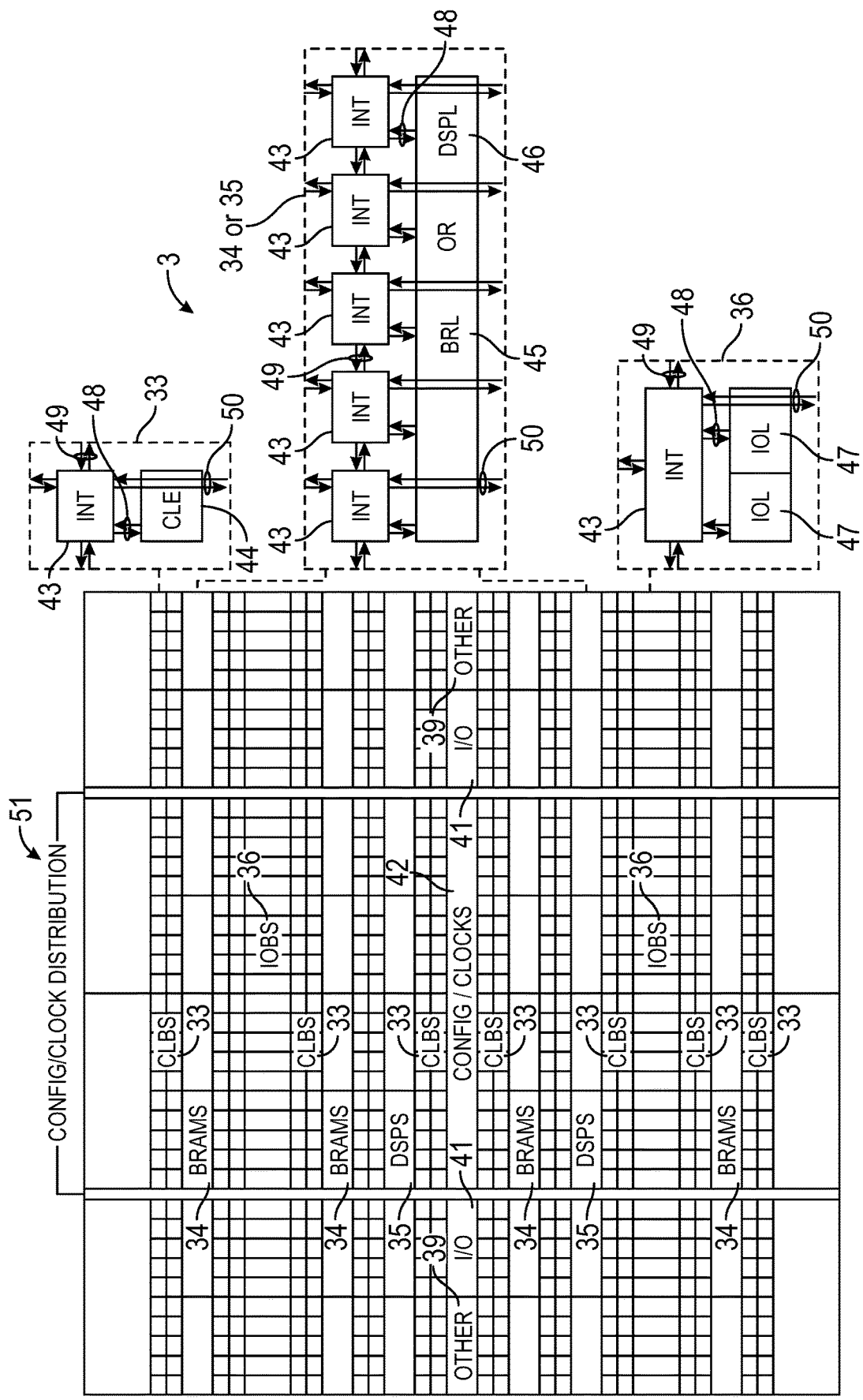
FIG. 11B illustrates a field programmable gate array (FPGA) implementation of a programmable IC according to an example.

FIG. 11B illustrates a field programmable gate array (FPGA) implementation of the PL 3 according to an example. The PL 3 shown in FIG. 11B can be used in any example of the programmable devices described herein. The PL 3 includes a large number of different programmable tiles including configurable logic blocks ("CLBs") 33, random access memory blocks ("BRAMs") 34, input/output blocks ("IOBs") 36, configuration and docking logic ("CONFIG/CLOCKS") 42, digital signal processing blocks ("DSPs") 35, specialized input/output blocks ("I/O") 41 (e.g., configuration ports and clock ports), and other programmable logic 39 such as digital dock managers, analog-to-digital converters, system monitoring logic, and so forth.

In some PLs, each programmable tile can include at least one programmable interconnect element ("INT") 43 having connections to input and output terminals 48 of a programmable logic element within the same tile, as shown by examples included at the top of FIG. 11B. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 501 can span one or more logic blocks. The programmable interconnect elements 43 taken together with the general routing resources implement a programmable interconnect structure ("programmable interconnect") for the illustrated PL.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements (which can include the FFT circuits in FIGS. 1-5). An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 11B) is used for configuration, clock, and other control logic. Vertical columns 51 extending from this horizontal area or column are used to distribute the clocks and configuration signals across the breadth of the PL.

Some PLs utilizing the architecture illustrated in FIG. 11B include additional logic blocks that disrupt the regular columnar structure making up a large part of the PL. The additional logic blocks can be programmable blocks and/or dedicated logic.

Note that FIG. 11B is intended to illustrate only an exemplary PL architecture. For example, the numbers of logic blocks in a row, the relative width of the rows, the number and order of rows, the types of logic blocks included in the rows, the relative sizes of the logic blocks, and the interconnect/logic implementations included at the top of FIG. 11B are purely exemplary. For example, in an actual PL more than one adjacent row of CLBs is typically included wherever the CLBs appear, to facilitate the efficient implementation of user logic, but the number of adjacent CLB rows varies with the overall size of the PL.

Figure 11C:
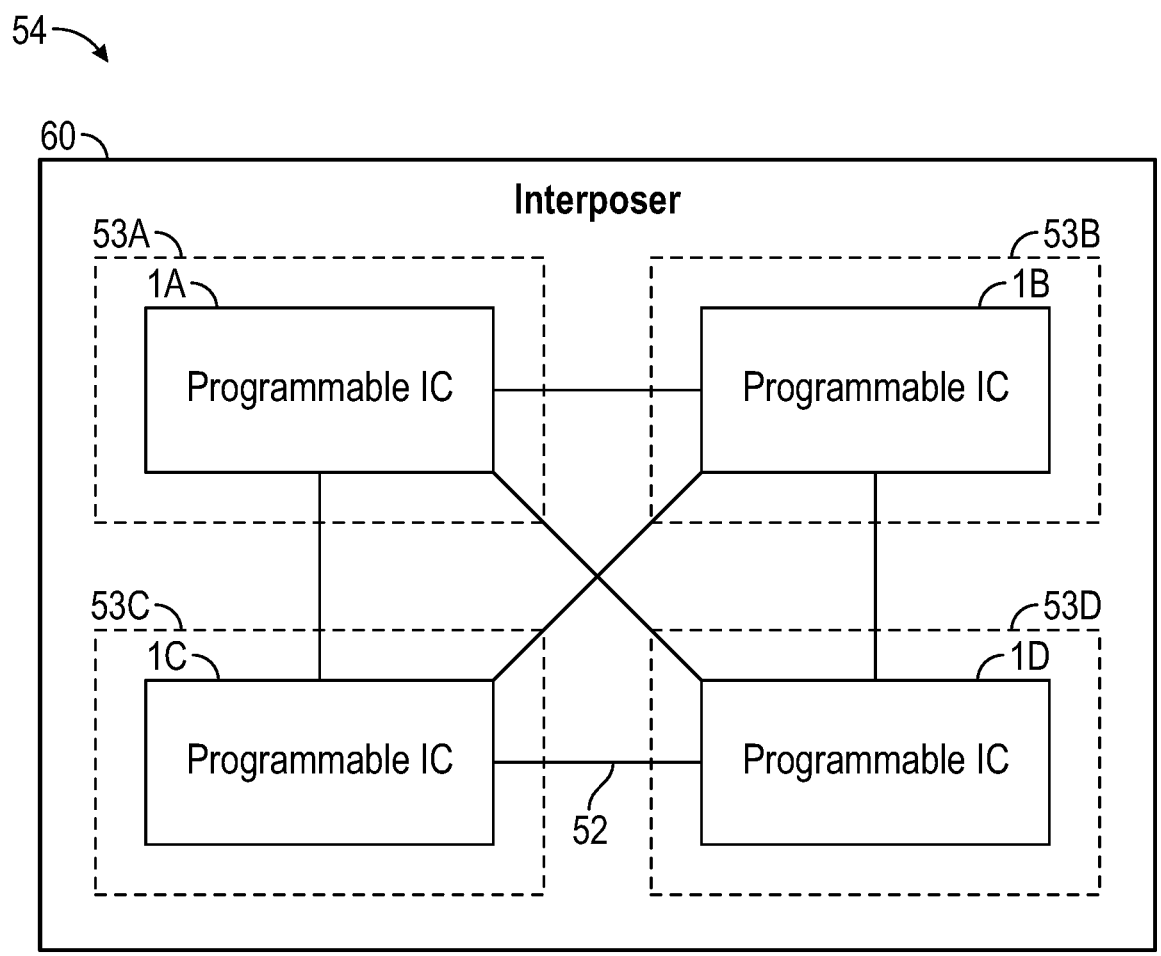
FIG. 11C is a block diagram depicting a multi-integrated circuit (IC) programmable device according to an example.

FIG. 11C is a block diagram depicting a multi-die programmable device 54 according to an example. The multi-die programmable device 54 includes a plurality of programmable devices 1, e.g., programmable devices 1A, 1B, 1C, and 1D. In an example, each programmable device 1 is an IC die disposed on an interposer 60. Each programmable device 1 comprises a super logic region (SLR) 53 of the programmable device 54, e.g., SLRs 53A, 53B, 53C, and 53D. The programmable devices 1 are interconnected through conductors on the interposer 60 (referred to as super long lines (SLLs) 52) and inter-die interconnect circuits 64 disposed within each of the programmable devices 1. The programmable ICs could include hardened portions that include the mixers circuits described above in FIGS. 1-4.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A digital front end (DFE), comprising:
   first and second mixers implemented in hardened logic, each comprising a plurality of subunits; and
   circuitry configured to form inter-mixer communication paths connecting at least one of the plurality of subunits in the first mixer to at least one of the plurality of subunits in the second mixer,
   wherein the first and second mixers are configured to, when operating in a downlink (DL) path of a radio, synchronously operate to effectively form a single, larger mixer using the inter-mixer communication paths.

2. The DFE of claim 1, wherein the inter-mixer communication paths comprise:
   a first path coupling an output of a first subunit of the plurality of subunits in the first mixer to an input of a second subunit of the plurality of subunits in the second mixer; and
   a second path coupling an output of a third subunit of the plurality of subunits in the second mixer to an input of a fourth subunit of the plurality of subunits in the first mixer,
   wherein the second and fourth subunits combine data received on the first and second paths with carrier data received from respective digital up converters (DUCs) in the DFE.

3. The DFE of claim 2, wherein each of the plurality of subunits in the first and second mixers comprises a bypass path to bypass internal mixer circuitry, wherein, when operating in the DL path, the first and third subunits use their bypass paths when transmitting data to the second and fourth subunits, respectively, while the second and fourth subunits do not use their bypass paths.

4. The DFE of claim 1, wherein the first and second mixers are configured to switch between operating in the DL path to operating in an uplink (UL) path of the radio using time division duplexing (TDD).

5. The DFE of claim 4, wherein, when operating in the UL path, the first and second mixers do not use the inter-mixer communication paths to communicate.

6. The DFE of claim 4, wherein the first and second mixers each comprises at least one controllable oscillator, wherein, when switching between operating in the DL and the UL path, DL states and UL states of the controllable oscillators in the first and second mixers are maintained.

7. The DFE of claim 6, wherein the DL state has a different frequency or phase than the UL state of the controllable oscillator.

8. The DFE of claim 1, further comprising:
   third and fourth mixers implemented in hardened logic, wherein the third and fourth mixers are configurable such that:
   the third and fourth mixers provide the option of being synchronized with the first and second mixers to be part of the radio, and
   the third and fourth mixers provide the option of being synchronized with each other, but not with the first and second mixers, to be part of a second radio.

9. The DFE of claim 8, wherein the third and fourth mixers are configurable such that the first, second, and third mixers provide the option of being synchronized to be part of the radio but the fourth mixer is part of the second radio.

10. The DFE of claim 1, wherein the first and second mixers comprise state capture logic configured to capture states of controllable oscillators in the first and second mixers, wherein the first and second mixers are configured to:

move a carrier processed using a controllable oscillator in the first mixer to the second mixer by:

determining a phase offset between the controllable oscillators in the first and second mixers using the state capture logic, and mirroring the states of the controllable oscillators using the phase offset.

11. A DFE, comprising:

first and second mixers implemented in hardened logic, wherein the first and second mixers are configured to synchronously operate to effectively form a first larger mixer for use in a downlink (DL) path of a radio; and third and fourth mixers implemented in hardened logic, wherein the third and fourth mixers are configured to synchronously operate to effectively form a second larger mixer for use in an uplink (UL) path of the radio.

12. The DFE of claim 11, wherein each of the first, second, third, and fourth mixers comprises a plurality of subunits, wherein the DFE further comprises:

circuitry configured to form inter-mixer communication paths connecting at least one of the plurality of subunits in the first mixer to at least one of the plurality of subunits in the second mixer, wherein the first and second mixers are configured to, when operating in the DL path of the radio, use the inter-mixer communication paths to form the first larger mixer.

13. The DFE of claim 12, wherein the inter-mixer communication paths comprise:

a first path coupling an output of a first subunit of the plurality of subunits in the first mixer to an input of a second subunit of the plurality of subunits in the second mixer; and a second path coupling an output of a third subunit of the plurality of subunits in the second mixer to an input of a fourth subunit of the plurality of subunits in the first mixer, wherein the second and fourth subunits combine data received on the first and second paths with carrier data received from respective digital up converters (DUCs) in the DFE.

14. The DFE of claim 13, wherein each of the plurality of subunits in the first and second mixers comprises a bypass path to bypass internal mixer circuitry, wherein, when operating in the DL path, the first and third subunits use their bypass paths when transmitting data to the second and fourth subunits, respectively, while the second and fourth subunits do not use their bypass paths.

15. The DFE of claim 12, wherein, when operating in the UL path, the third and fourth mixers do not use the inter-mixer communication paths to communicate.

16. An integrated circuit, comprising:

first and second mixers implemented in hardened logic, each comprising a plurality of subunits; and circuitry configured to form inter-mixer communication paths connecting a subset of the plurality of subunits in the first mixer to a subset of the plurality of subunits in the second mixer, wherein the first and second mixers are configured to, when operating in a downlink (DL) path of a radio, effectively form a single, larger mixer using the inter-mixer communication paths.

17. The integrated circuit of claim 16, wherein the inter-mixer communication paths comprise:

a first path coupling an output of a first subunit of the subset of subunits in the first mixer to an input of a second subunit of the subset of subunits in the second mixer; and a second path coupling an output of a third subunit of the subset of subunits in the second mixer to an input of a fourth subunit of the subset of subunits in the first mixer, wherein the second and fourth subunits combine data received on the first and second paths with carrier data received from respective digital up converters (DUCs) in a DFE.

18. The integrated circuit of claim 17, wherein each of the plurality of subunits in the first and second mixers comprises a bypass path to bypass internal mixer circuitry, wherein, when operating in the DL path, the first and third subunits use their bypass paths when transmitting data to the second and fourth subunits, respectively, while the second and fourth subunits do not use their bypass paths.

19. The integrated circuit of claim 16, wherein the first and second mixers are configured to switch between operating in the DL path to operating in an uplink (UL) path of the radio using time division duplexing (TDD).

20. The integrated circuit of claim 19, wherein, when operating in the UL path, the first and second mixers do not use the inter-mixer communication paths to communicate.

* * * * *